United States Patent [19]

Kimura

[11] Patent Number: 5,523,968
[45] Date of Patent: Jun. 4, 1996

[54] IC SEMICONDUCTOR MEMORY DEVICES WITH MAINTAINED STABLE OPERATION AND LOWER OPERATING CURRENT CHARACTERISTICS

[75] Inventor: Masakazu Kimura, Suwa, Japan

[73] Assignee: Seiko Epson Corporation, Tokyo, Japan

[21] Appl. No.: 523,370

[22] Filed: Aug. 31, 1995

Related U.S. Application Data

[63] Continuation of Ser. No. 407,402, Mar. 17, 1995, abandoned, which is a continuation of Ser. No. 131,840, Oct. 4, 1993, abandoned, which is a continuation-in-part of Ser. No. 821,250, Jan. 10, 1992, Pat. No. 5,254,870, which is a continuation of Ser. No. 457,798, Feb. 14, 1990, abandoned.

[51] Int. Cl.$^6$ .................................................. H01L 27/10
[52] U.S. Cl. ............................ 365/174; 365/51; 365/53; 257/659
[58] Field of Search .................................. 365/174, 182, 365/185, 900, 51, 53; 257/659

[56] References Cited

U.S. PATENT DOCUMENTS

| | | | |
|---|---|---|---|
| 4,513,304 | 4/1985 | Takemae | 357/236 |
| 4,849,801 | 7/1989 | Honjyo et al. | 357/51 |
| 4,853,894 | 8/1989 | Yamanaka et al. | 365/53 |
| 4,984,200 | 1/1991 | Saitoo et al. | 365/154 |
| 5,070,378 | 12/1991 | Yamagata | 365/53 |
| 5,254,870 | 10/1993 | Kimura | 257/659 |

FOREIGN PATENT DOCUMENTS 62-169472  7/1987  Japan .

OTHER PUBLICATIONS

C. H. Stapper, Jr., "Flat Film Memory", IBM TDB, vol. 6, No. 2, Jul. 1963, pp. 71–72.

Primary Examiner—Viet Q. Nguyen

[57] ABSTRACT

Semiconductor memory devices, such as, SRAM IC memory devices, include a shield structure for shielding load elements in the memory cells of the memory devices from electric fields generated by surrounding active or passive elements, such as, an underlying MOSFET or a voltage supplying interconnect, to prevent deterioration of the operational resistance values and characteristics of the load elements. In the case of resistance elements utilized as load elements, a partial shield structure, i.e., a shield layer, at a constant voltage or zero volts, spatially underlying only a portion of the length of the resistance element is adequate to substantially remove the effect of such electric fields. In the case of TFT channel devices having channel offset regions utilized as load elements, a shield structure, i.e., a shield layer spatially underlying the TFT channel offset region is adequate to substantially remove the effect of such electric fields. In the case of a p-channel TFT, the shield is set at a constant voltage and in the case of a n-channel TFT, the shield is set at zero volts. The use of such shield structures permits decrease in the consumption current during waiting or OFF time conditions of the memory cell operation so that overall current consumption in operation of the memory device is significantly decreased.

16 Claims, 8 Drawing Sheets

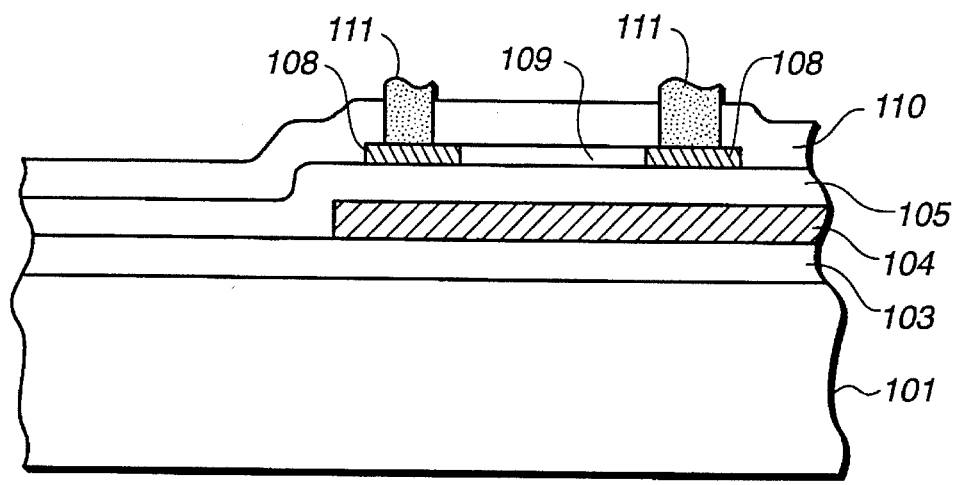
FIG._1
(PRIOR ART)
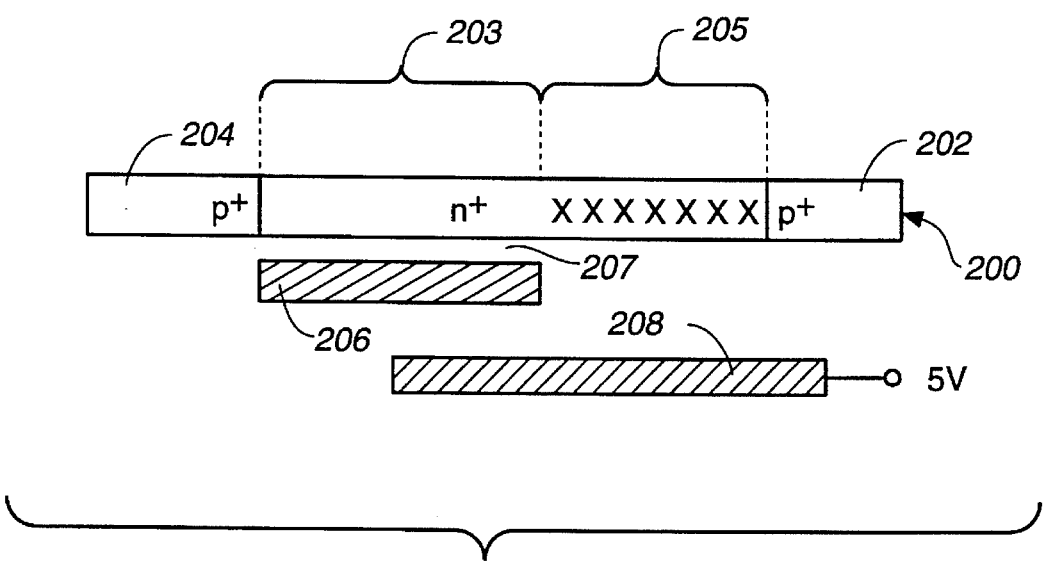
FIG._4
(PRIOR ART)

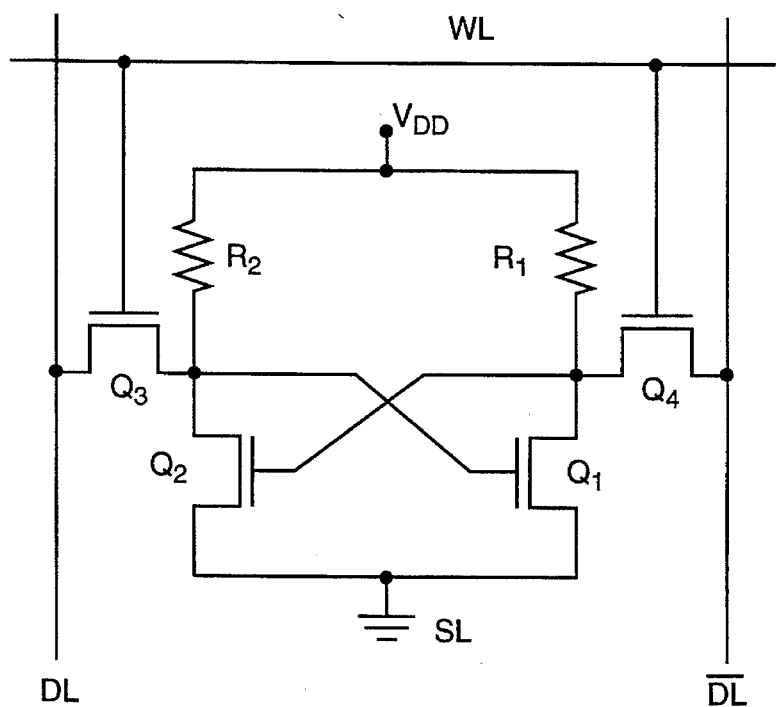
FIG._2
*(PRIOR ART)*
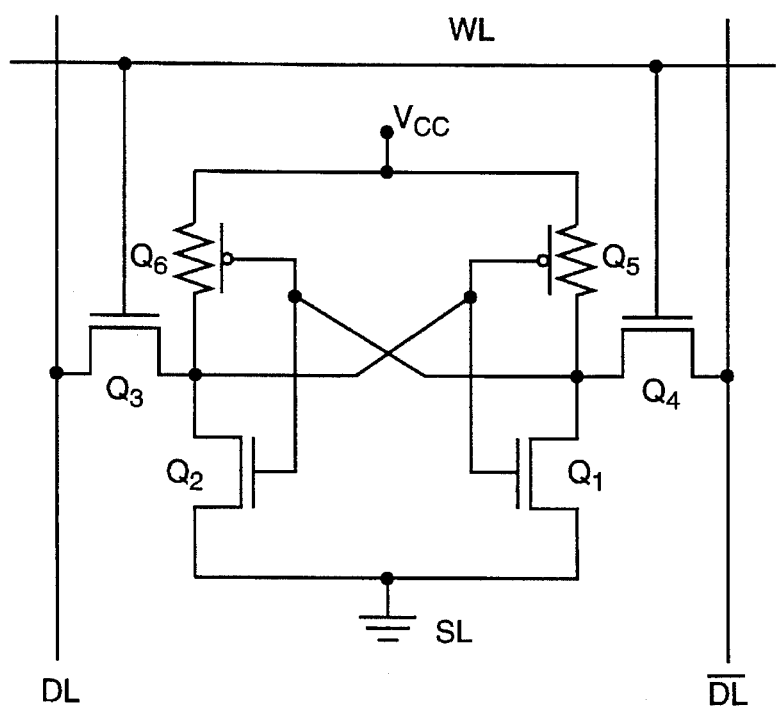
FIG._3
*(PRIOR ART)*

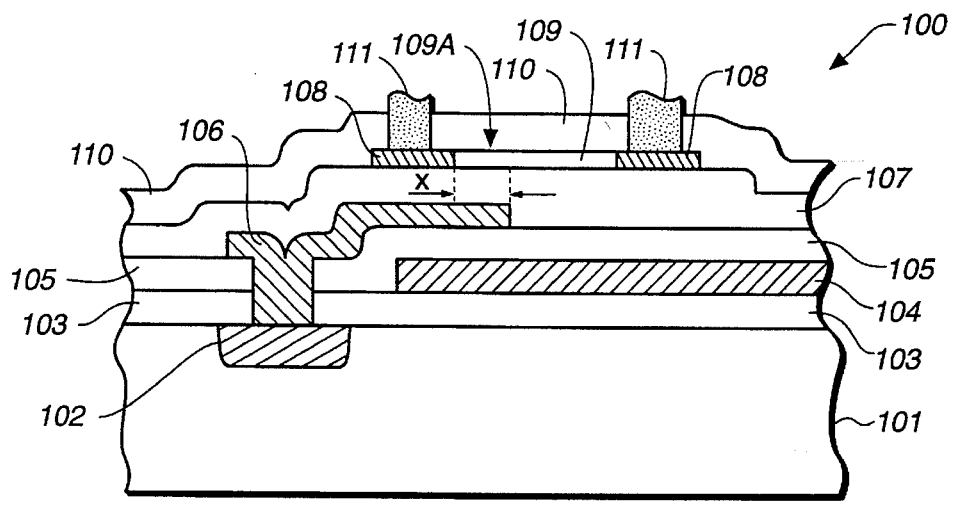
FIG._5
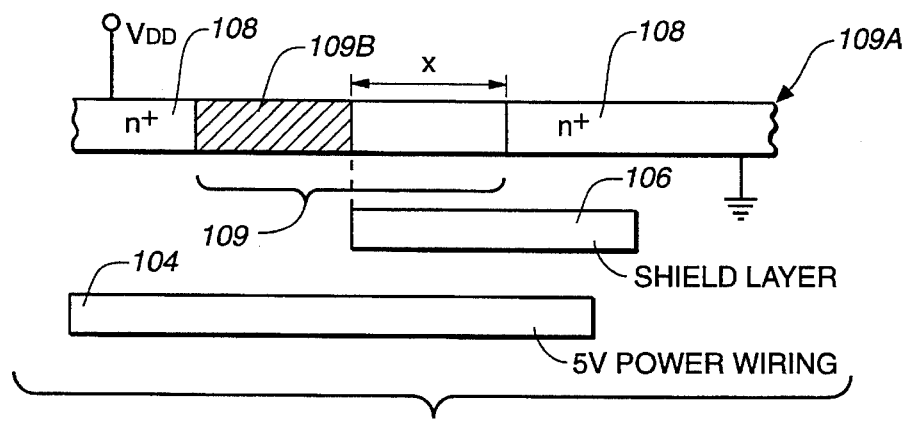
FIG._7
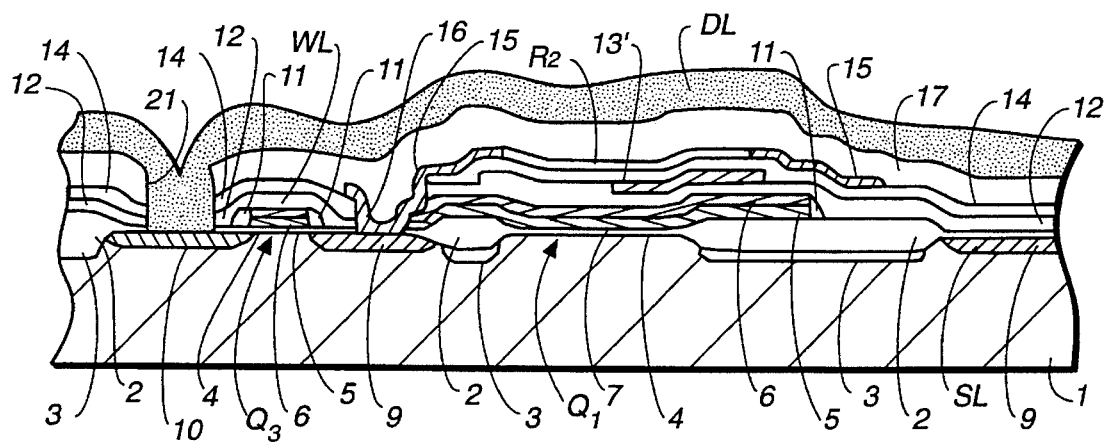
FIG._8

FIG._6A
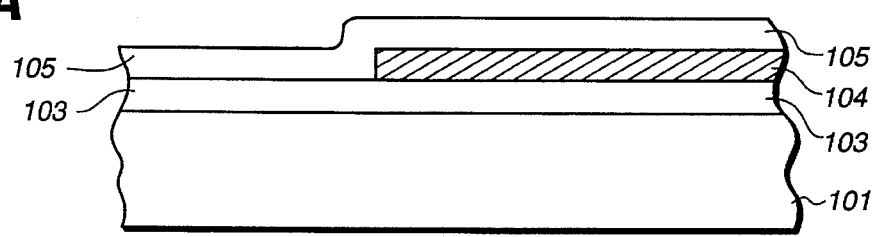
FIG._6B
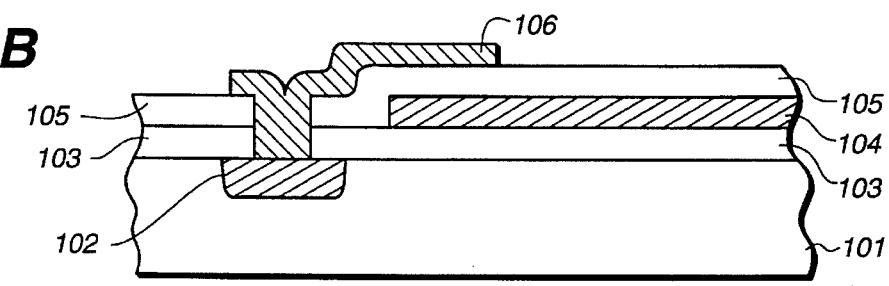
FIG._6C
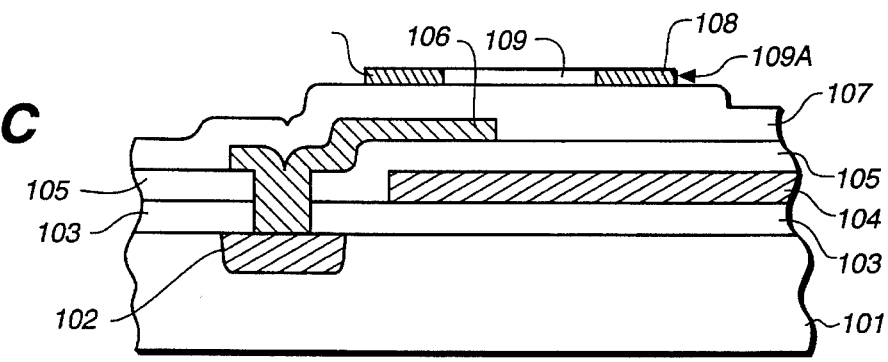
FIG._6D
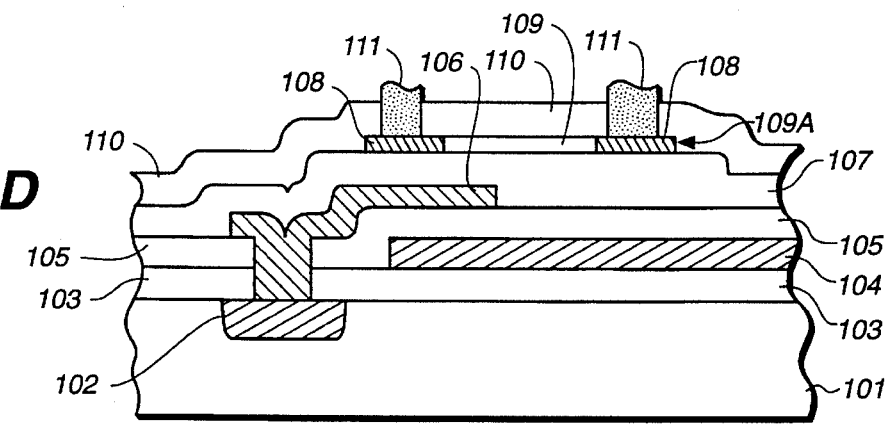

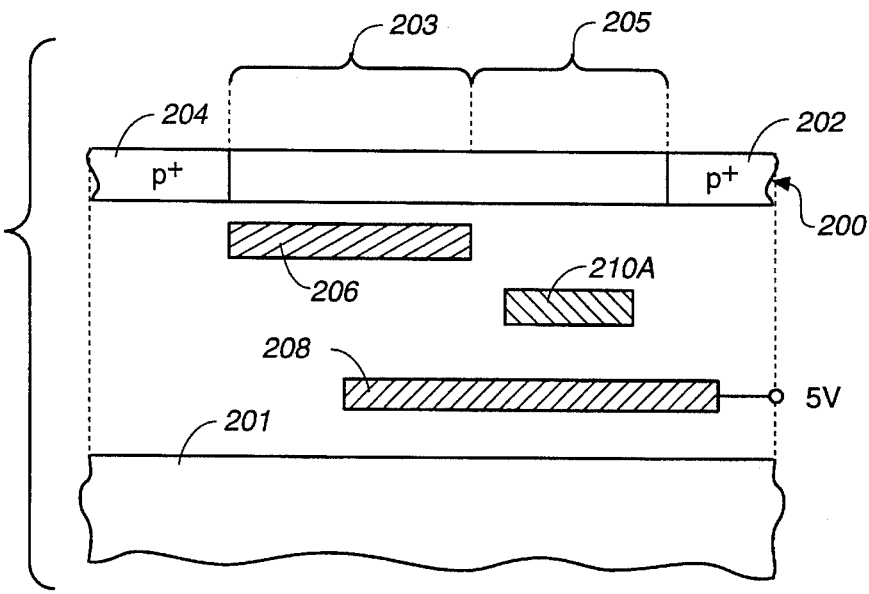
FIG._9A
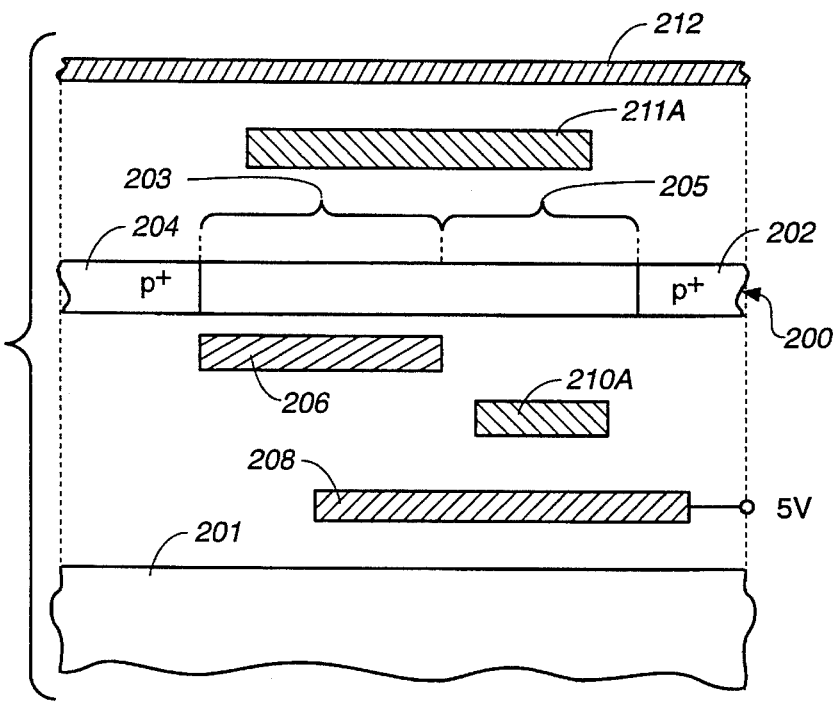
FIG._10A

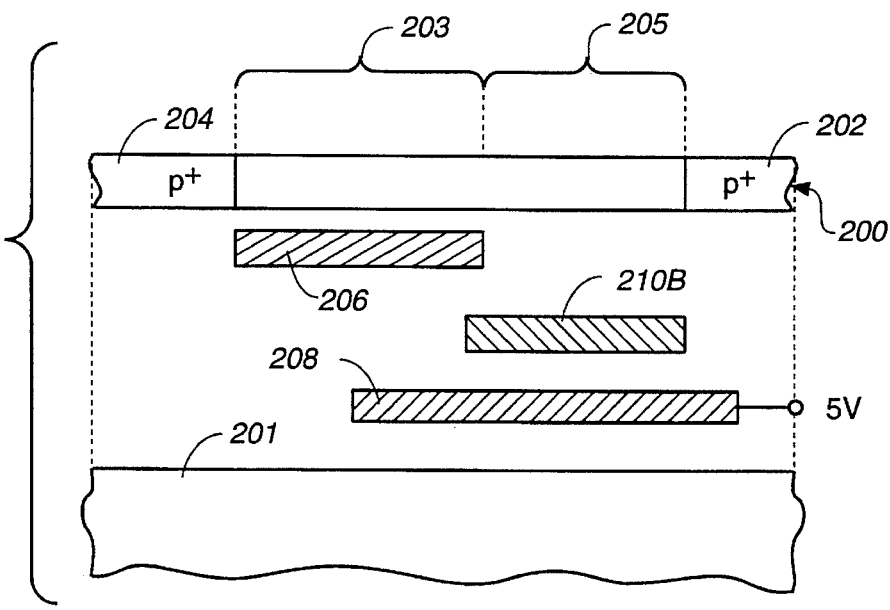
FIG._9B
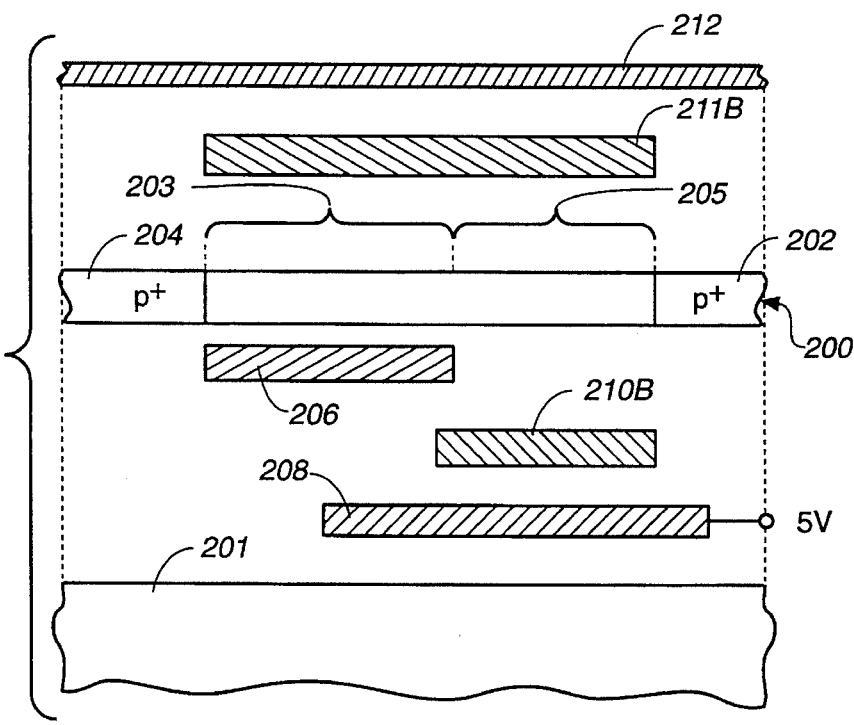
FIG._10B

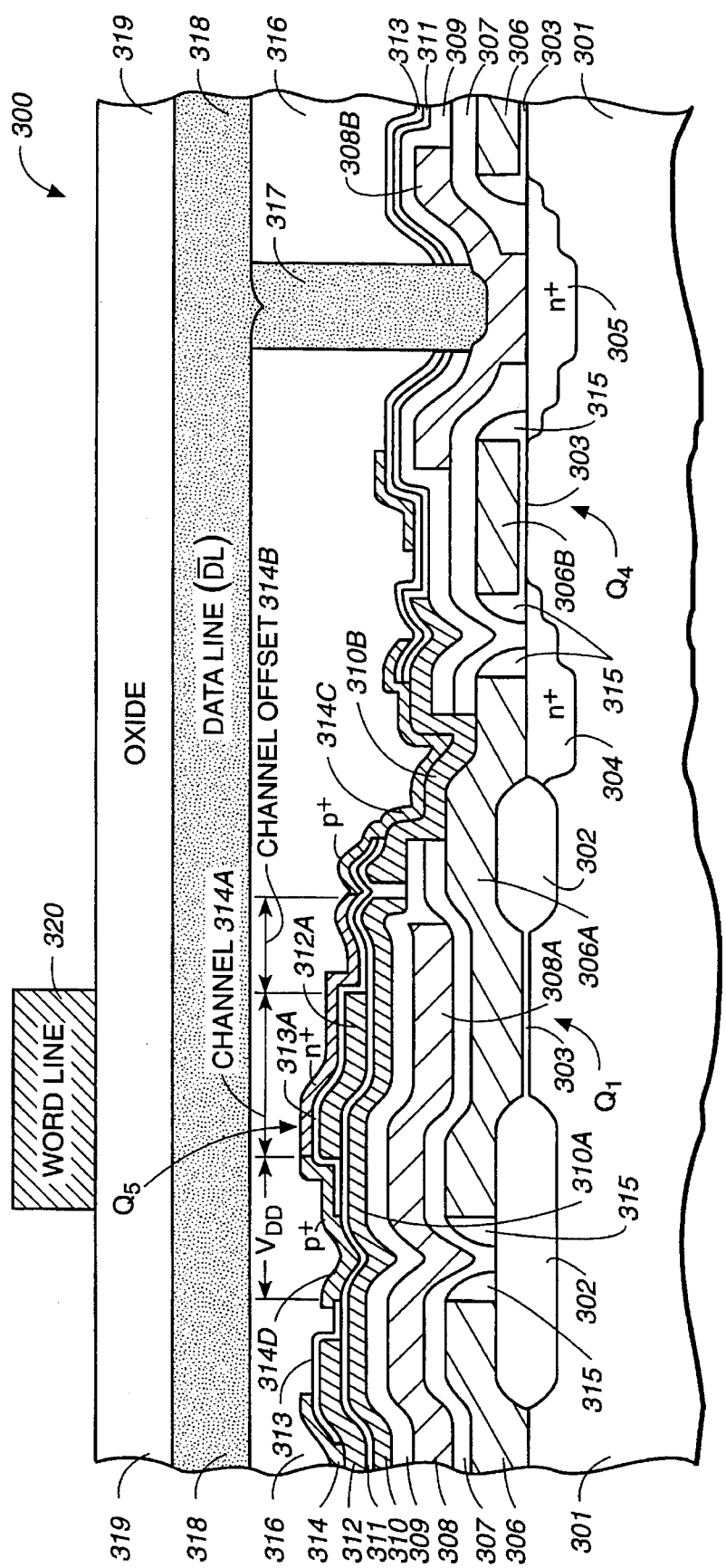
FIG._11

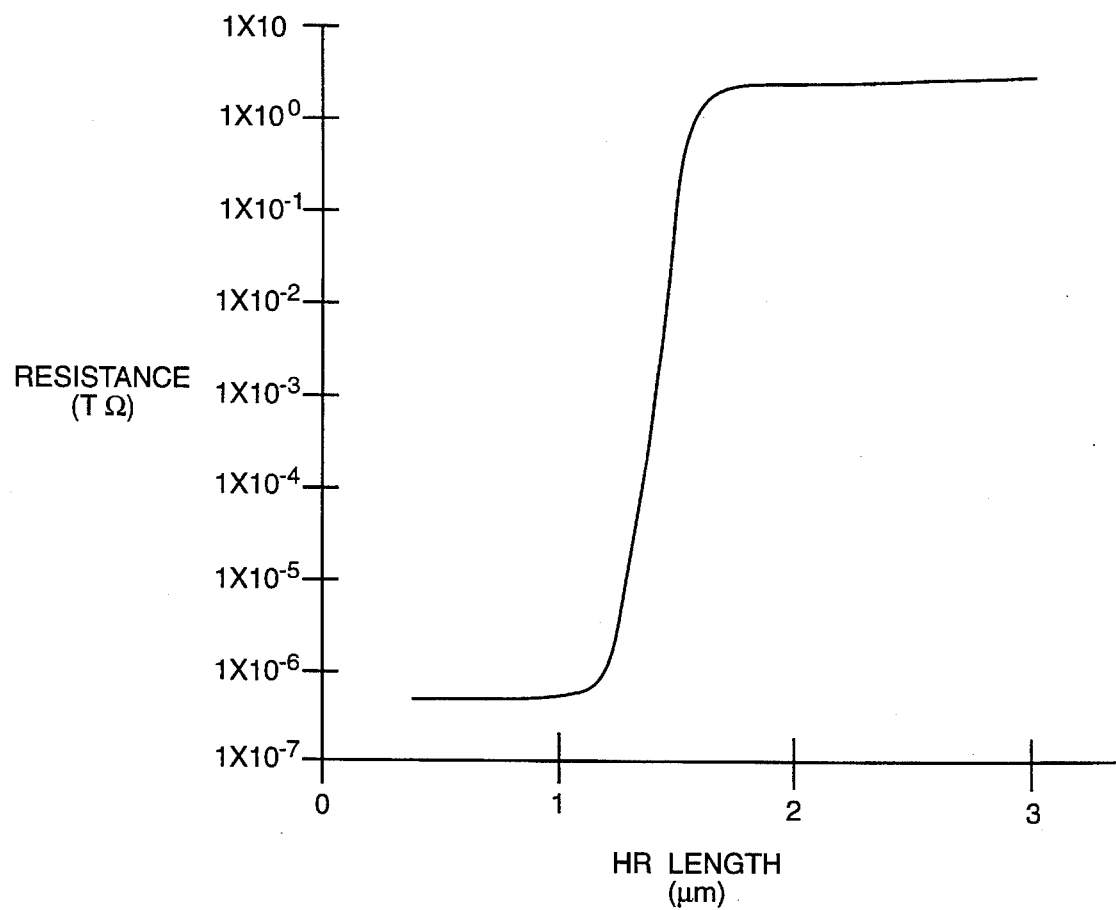
FIG._12

IC SEMICONDUCTOR MEMORY DEVICES WITH MAINTAINED STABLE OPERATION AND LOWER OPERATING CURRENT CHARACTERISTICS

REFERENCE TO RELATED APPLICATIONS

This application is a Continuation of U.S. patent application Ser. No. 08/407,402, filed Mar. 17, 1995, now abandoned; which is a Continuation of U.S. patent application Ser. No. 08/131,840, filed Oct. 4, 1993, now abandoned; which is a Continuation-in-Part of U.S. patent application Ser. No. 07/821,250, filed Jan. 10, 1992, now U.S. Pat. No. 5,254,870, issued Oct. 19, 1993; which is a continuation of U.S. patent application Ser. No. 07/457,798, filed Feb. 14, 1990, now abandoned.

BACKGROUND OF THE INVENTION

This invention relates generally to an IC semiconductor memory device and more particularly to improvements relating to cell packing density while maintaining stable cell operation and small leakage current and lower on/off current ratio.

As new lithographic techniques are developed along with improvements in other semiconductor processing steps, it becomes continuously possible to reduce memory cell area. However, as is the case, as cell size is reduced, the properties of the cell are detrimentally affected so that new designs must be incorporated to achieve stable cell operation with good current ratio and small leakage current characteristics. In the case of memory cells incorporating load elements, such as in static random access memories (SRAM's) utilizing resistance loads in the form of a resistor or a thin film transistor, the operating characteristics of these elements is materially affected by reduced circuit scale integration to achieve more compact density.

FIGS. 1 and 2 show the conventional case for SRAM's having load elements comprising a resistance element. In FIG. 1, the semiconductor device comprises a substrate 101 on which is formed the conventional thin insulating film 103 for isolation. A conductive layer, forming an interconnect wiring 104, is formed over film 103 and insulating film 105 is formed over wiring 104 separating the latter from the structure above. A polycrystalline layer is then formed over insulating layer 105 and comprises low resistance regions 108 between which is high resistance (HR) region 109. Low resistance regions 108 are implanted with impurities, such as, phosphorus or boron, to render them highly conductive. On the other hand, HR region 109 contains a slight amount of impurities or no impurities at all. Lastly, a third insulating film is deposited over the polycrystalline silicon layer after which vias are formed to low resistance regions 108 to received the deposition of metal interconnect wiring 111, such as, aluminum.

HR region 109 is open to field effects created by voltage applications at wiring 104. These field effects directly affect the resistance value and pinch off characteristics of HR region 109 resulting in undesirable fluctuations and changes in the operating characteristics of the resistance element.

The conventional equivalent circuit structure of a memory cell utilized in a SRAM is shown in FIG. 2 wherein the load elements comprise high resistance polycrystalline silicon. As shown in FIG. 2, the polycrystalline silicon resistance load type memory cell comprises a flip-flop structure comprising a dual inverter, utilized for storing a value of information. One inverter is composed of driver MOSFET $Q_1$ and a HR element $R_1$ of polycrystalline silicon, and the other inverter is composed of driver MOSFET $Q_2$ and a HR element $R_2$ of polycrystalline silicon. An output of each inverter is connected as an input to the other inverter, i.e., as the gate input respectively to the driver MOSFETs $Q_1$ and $Q_2$.

The flip-flop structure is includes transfer MOSFETs $Q_3$ and $Q_4$ connected to the output of the inverters to receive from or transfer to a respective data line DL or $\overline{DL}$ a value of information. A power supply, $V_{DD}$, is connected to one end of each of the HR elements $R_1$ and $R_2$, the other ends of which are connected to the drain regions of driver MOSFETs $Q_1$ and $Q_2$ and the source regions of transfer MOSFETs $Q_3$ and $Q_4$. The source regions of MOSFETs $Q_1$ and $Q_2$ are connected to ground (SL). Word line, WL, is connected to the gates of transfer MOSFETs $Q_3$ and $Q_4$ and the drain regions of these transistors are connected respectively to data lines DL and $\overline{DL}$.

The memory cell of FIG. 2 is formed by means of forming MOSFETs $Q_1$–$Q_4$ on semiconductor substrate wherein a first deposited conductive layer, such as, a polycide film, is utilized to form the gates for these transistors. Then, an insulating interlayer film is formed followed by the formation of an intrinsic polycrystalline silicon film which is formed over the surface of the insulating interlayer film. Then, regions of the intrinsic polycrystalline silicon film which will be utilized as HR regions are masked with a mask pattern layer and the exposed regions of this film are subjected to phosphorus diffusion or ion implantation of phosphorus atoms to render these regions of low resistance. Next, the mask pattern layer is removed and, then, the polycrystalline silicon film is patterned to assume the HR strip configuration and associated integral interconnect wiring wherein the strip configurations comprise intrinsic polycrystalline silicon HR regions $R_1$ and $R_2$ and integral low resistance regions, such as at 108 in FIG. 1. Problems are inherent in the foregoing described structure, particularly in the case where the integration scale of the memory cell is decreased, in that the consumption or leakage current, $I_{DDS}$, i.e., the current flow from the power supply, $V_{DD}$, to ground via $R_1$ or $R_2$ during standby when a respective driver transistor is driven into and remains in its ON state, is large and unacceptable. Typically, in the case of a 256K SRAM or a 1M SRAM, the leakage current, $I_{DDS}$, is around 1 µA with the potential drop between $V_{DD}$ and $V_{SS}$ of approximately 5 V.

To increase the length of HR regions $R_1$ and $R_2$, is not acceptable if the size of the cell is correspondingly increased. One way to reduce the leakage current would be to merely decrease the film thickness of the intrinsic polycrystalline silicon film. This would generally imply that the resistance values of resistance elements $R_1$ and $R_2$ would increase. However, the thinner the film thicknesses of the polycrystalline silicon film forming HR regions $R_1$ and $R_2$, the greater the influence in their operational affect due to the electric field effects imposed by adjacently disposed active elements, such as, MOSFETs $Q_1$ and $Q_2$, or an adjacent interconnect wiring, such as, wiring 104 in FIG. 1, or a biased semiconductive substrate either of which is set at a potential above ground. In the case of an underlying transistor comprising an interconnect layer serving as the source and drain region and another conductive layer formed to serve as a gate, the resistance values of HR regions $R_1$ and $R_2$ will vary depending upon the instantaneous state of operation of the transistor and corresponding effect of field ON or OFF conditions. Thus, it is difficult to manufacture these memory cells particularly according to either standard or new lithographic approaches imposing smaller integration scale with maintained stability of the resistance value design into HR regions $R_1$ and $R_2$ as well as with maintained low and stabilized leakage current, $I_{DDS}$.

In the case of load elements comprising polycrystalline silicon transistors, it is difficult to reduce cell area toward smaller scale integration because a semiconductor memory, such as, a SRAM, utilize SRAM cells having a large cell ratio to maintain stable operation. To achieve this, the channel width of the driver MOSFET must be wider than that of the transfer MOSFET thereby directly effecting cell area reduction. FIG. 3 illustrates the conventional equivalent circuit for a memory cell of an SRAM utilizing polycrystalline silicon transistors as load elements in the cell. As shown in FIG. 3, the polycrystalline silicon transistor load type memory cell comprises a flip-flop structure comprising a dual inverter, utilized for storing a value of information. One inverter is composed of driver MOSFET $Q_1$ and a polycrystalline silicon load TFT $Q_5$, e.g., a polysilicon PMOS, and the other inverter is composed of driver MOSFET $Q_2$ and a polycrystalline silicon load TFT $Q_6$, e.g., a polysilicon PMOS. An output of each inverter is connected as an input to the other inverter, i.e., as the gate input respectively to the driver MOSFETs $Q_1$ and $Q_2$ and the gate input respectively to the load TFTs $Q_5$ and $Q_6$. The flip-flop structure includes transfer MOSFETs $Q_3$ and $Q_4$ connected to the output of the inverters to receive from or transfer to a respective data line DL or $\overline{DL}$ a value of information. A power supply, $V_{cc}$, is connected to one end of each of the load TFTs $Q_5$ and $Q_6$, the other ends of which are connected to the drain regions of driver MOSFETs $Q_1$ and $Q_2$ and the source regions of transfer MOSFETs $Q_3$ and $Q_4$. The source regions of MOSFETs $Q_1$ and $Q_2$ are connected to ground. Word line, WL, is connected to the gates of transfer MOSFETs $Q_3$ and $Q_4$ and the drain regions of these transistors are connected respectively to data lines DL and $\overline{DL}$.

In the case of the load TFTs $Q_5$ and $Q_6$, these devices include a thin polycrystalline silicon layer 200, illustrated in FIG. 4. Polycrystalline silicon layer 200 comprises a channel region 203 that is slightly doped with impurities or has no impurities, i.e., is intrinsic. Channel region 203 is integral to doped drain region 202 and doped source region 204. Polysilicon gate 206 is separated from channel region 203 by gate oxide layer 207. The structure of these TFTs include an off-set region 205 to prevent an increase of the offstate current as well as the drain current, $I_D$, of the gate back voltage to achieve high on/off characteristics. However, owing to the influence of an approximate electric field from an active element, such as, driver MOSFETs $Q_1$ and $Q_2$, or from an interconnect wiring above or below load TFTs $Q_5$ and $Q_6$, such as interconnect wiring 208 in FIG. 4, or a biased semiconductive substrate, off-set region 205 is inverted by the field influence, as indicated by the marking "xxxxxx", and deterioration of the on/off characteristics occurs to load TFTs $Q_5$ and $Q_6$. Thus, it is important to eliminate the influence of such field effects, especially where smaller integration scale are to be utilized because the influence becomes more prominent as thickness layers are decreased to meet scale reduction rules and requirements.

It is an object of the present invention to provide a load element either of the polycrystalline silicon resistor type or of the polycrystalline silicon transistor type in memory cells of a semiconductor memory that provide a stabilized resistance value, low and stabilized leakage current, and a small on/off current ratio when utilizing smaller scale integration and, correspondingly, smaller cell size and cell ratio.

It is a further object of this invention to shield a load element of the polycrystalline silicon resistor type or of the polycrystalline silicon transistor type in memory cells of a semiconductor memory from the effects of a surrounding or adjacent electric field or other such fields that affect the stabilized operation and operating characteristics of the load element.

SUMMARY OF THE INVENTION

According to this invention, a load element is shielded from field effects produced in semiconductor memory interior structure, such as, a SRAM, by means a conductive shield that is position either under or over the load element, or both, wherein the shielding layer at least partially shields the load element to substantially eliminate the influence of the field on the operating characteristics of the load element. The load element may be fully shielded by the influence of the field but also need only function to partially should the load element under certain conditions and still substantially eliminate the influence of surrounding fields from affecting the operating properties of the load element. The use of partial shields also help by providing a larger degree in freedom of design layout while reducing the scale integration so that large extending conductive shield layers covering the full extent of the load element are not required. The load element in such circumstances may be comprised of a load resistance in the form of a polycrystalline silicon resistor or a polycrystalline silicon TFT. In the case of the TFT load element, the field effects on the off-set region of the TFT device can also be reduced or substantially eliminated by means of thickening an insulating interlayer. The shielding layer is connected to a potential reference or ground.

With respect to a load resistance comprising a HR element, this invention comprises a conductive shielding layer formed below or above the HR element and separated from the element by an insulating interlayer. The shielding layer substantially shields the element from the full extent of an electric field developed on the other side of the shielding layer by partial shielding the element from electric field exposure. Partial shielding, i.e., where the resistance region spatially overlaps one side or portion of the conductive layer, is sufficient under predetermined conditions of coverage of the shielding layer of the resistance element to maintain its high resistance value without be set into a switched ON state. This switched ON state is characterized by an inversion region being formed in the HR element due to exposure to an adjacent field when a voltage is applied across the HR element. The shielding layer should provide for sufficient spatial overlap of the HR element so that the inversion region will not occur in the HR element and the high resistance value of the HR element will be stabilized and maintained.

The improvement of the present invention generally comprises a polycrystalline silicon high resistance load type memory cell having a HR element with a resistance value of 100 G$\Omega$ to 10 T$\Omega$ or a length in the range of 2 μm to 4 μm and a conductive shielding layer connected to a constant potential source and having a surface area formed adjacent to the HR element and spatial overlap of at least a portion of the HR element surface but separated therefrom by an insulating interlayer. As a result, the HR element will not be subjected to the influence of electric fields of active or passive elements positioned beneath or above the position of the HR element in the memory integrated circuit structure where such a partial shielding layer is interposed between the HR element and the active or passive element. Further, a highly stable and reliable semiconductor device is achieved exhibiting low and stable leakage current, $I_{DDS}$.

With respect to a load resistance comprising a TFT element, this invention comprises a conductive shielding layer formed below or above the offset region of the TFT element and separated from the element by an insulating interlayer. The spatially disposed shielding layer substantially shields the element off-set region by partially overlapping the element from electric field exposure. Also, if a sufficiently thick insulating layer is provided beneath the off-set region, the effects of an approximate electric field on the operating characteristics of the TFT element can be substantially removed. However, such thick insulating layers may not always be possible.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 1 is a sectional view of a conventional HR element in a semiconductor device.

FIG. 2 is an equivalent circuit for a memory cell of a SRAM utilizing load resistance in the form of HR polycrystalline silicon resistance elements.

FIG. 3 is an equivalent circuit for a memory cell of a SRAM utilizing load resistance in the form of TFT load elements.

FIG. 4 is an illustration of a conventional polycrystalline silicon TFT comprising a channel region and an off-set region with an associated gate employed in a semiconductor device.

FIG. 5 is a sectional view of a first embodiment of this invention relating to a semiconductor device having a shielded resistance load element comprising this invention.

FIGS. 6A–6D are sectional views illustrating the sequential steps of fabricating a semiconductor device according to this invention FIG. 7 is a schematic diagram of the principal of operation of a shield member of the first embodiment.

FIG. 8 is a sectional view of a second embodiment of this invention relating to a SRAM semiconductor device having a shielded resistance load element comprising this invention.

FIG. 9A is a schematic diagram of a third embodiment of this invention relating to a semiconductor device having a shielded TFT load element comprising this invention.

FIG. 9B is a schematic diagram of a modified form of the third embodiment of this invention relating to a semiconductor device having a shielded TFT load element comprising this invention FIG. 10A is a schematic diagram of a fourth embodiment of this invention relating to a semiconductor device having a shielded TFT load element comprising this invention.

FIG. 10B is a schematic diagram of a modified form of the fourth embodiment of this invention relating to a semiconductor device having a shielded TFT load element comprising this invention.

FIG. 11 is a sectional view of a fifth embodiment of this invention relating to a SRAM semiconductor device utilizing TFT load elements.

FIG. 12 is a graphic illustration of the resistance characteristic of a HR element of the type shown in FIG. 7 verses changes in HR element length.

DESCRIPTION OF THE PREFERRED EMBODIMENTS

Reference is now made to FIG. 5 wherein a first embodiment of this invention is disclosed relative to a semiconductor device 100 having a HR region 109. HR region 109 has a resistance value of more than 100 GΩ and generally in the range of 100 GΩ to 10 TΩ and a length in the range of 2 μm to 4 μm. The potential difference between $V_{DD}$ and $V_{SS}$ for a 256K SRAM, 1M SRAM or a 4M SRAM is typically 5 V and the standby leakage current, $I_{DDS}$, is in a region of about 1 μA. The resistance value for a 64K SRAM preferably falls within the range of 100 GΩ to 10 RΩ, a 256K SRAM is preferably about 4 RΩ, and a 1M SRAM is preferably about 10 TΩ.

As shown in FIG. 5, semiconductor device 100 comprises a impurity diffusion region 102 is formed in semiconductor substrate 101 and an interconnect wiring 104 or other such active or passive element spatially formed above substrate 101 by means of separation provided by first insulating layer 103. A second insulating layer 105 is formed over wiring 104 with a via formed through insulating layers 103 and 105 to diffusion region 102. Conductive shielding member 106 is formed on insulating layer 105 and is electrically contacted to region 102. Conductive layer 106 is covered by third insulating layer 107. Polycrystalline silicon layer 109A is formed on third insulating layer 107 and includes HR region 109 and associated integral end, low resistance, $n^+$ type regions 108. The final or fourth insulating layer 110 is formed over polycrystalline silicon layer 109A and vias are formed for interconnect wiring 11, e.g., aluminum, to contact respective low resistance regions 108. Diffusion region 102 is then connected to ground via semiconductor substrate 101. Semiconductor device 100 is fabricated according to the following steps in conjunction with the sequential illustrations of FIGS. 6A–6D.

As shown in FIG. 6A, patterned interconnect wiring 104 is formed over first insulating film 103, e.g., silicon oxide, on substrate 101 followed by the deposition of insulating layer 105, e.g., silicon oxide, over first insulating layer 103 and wiring 104. Next, as shown in FIG. 5B, a via is formed in insulating layers 103 and 105 by means of selective etching performed by forming a resist pattern on the surface of film 105 and exposing the resist to form an opening through insulating layers 103 and 105 where the via is to be formed. Then, with a diluted solution of hydrofluoric acid, the via is formed through layers 103 and 105 and the resist pattern is thereafter removed. This is followed by the implant of impurities through the via to form the diffusion region 102, such as, using an acceleration energy of 60 KeV and a concentration of $6\times10^{15}$ cm$^{-2}$. The impurity ions are of the same conductivity type as substrate 101, such as, phosphorus or arsenic for a n-type substrate and boron for a p-type substrate. Region 102 provides for reduce contact resistance to substrate 101 upon the formation of polycrystalline silicon layer 106.

In preparation for the formation of polycrystalline silicon layer 106, a polycrystalline silicon film is deposited on insulating layer 105 having a film thickness of 4000 Å. This layer may be formed by means of a monosilane gas which is thermally decomposed at 620° C. This film is then rendered conductive by means of implanting impurities of the same conductivity type as substrate 101, reducing the resistance value of the film. The implantation dose may be, for example, a concentration of $5\times10^{15}$ cm$^{-2}$. This is followed by selective etching, e.g., by photoetching, of the film to form the desired contour and shape resulting in conductive layer 106 which will function as shielding for the subsequently deposited HR element 109A.

As shown in FIG. 6C, a third insulating layer 107 comprising a silicon oxide film, is formed on conductive layer 106 by means chemical vapor deposition. Next, a second polycrystalline silicon layer 109A is formed to have substantially the same contour and shape as polycrystalline silicon layer 106 via selective etching after HR element 109A has been formed. Second polycrystalline silicon layer 109A has a length and thickness to provide a required resistance value. For example, in the case of a 256K bit SRAM, the film may have a thickness of 1700 Å with a high resistance region having a length of 5 μm providing a resistance value of about 4 TΩ. In the case of a 1M bit SRAM, the film may have a thickness of 1000 Å with a high resistance region having a length of 4.5 μm providing a resistance value of about 10 TΩ. HR region 109 does not contain any impurity although there may be some impurity presence while achieving a sufficiently high resistance value. Utilizing conventional photoresist techniques, HR element 109 is masked by resist and exposed regions 108 are subjected to ion implantation to form low resistance connecting regions 108. As an example, the impurity employed may be phosphorus using an acceleration energy of 30 KeV and a concentration of $4 \times 10^{15}$ cm$^{-2}$. Thereafter, the resist is removed and a photoetching process is employed to define the proper contour and shape of HR element 109.

As shown in FIG. 6D, a fourth insulating layer 110 is formed by means chemical vapor deposition and having a thickness of about 3,000 Å.

At this time, the implanted impurities are activated by means of annealing in a nitrogen atmosphere for 20 minutes at a temperature of 950°. This is followed by the formation of contact holes by means of photoetching for interconnect wiring formed through insulating layer 110 to low resistance regions 108. Then, aluminum layer 111 is sputtered onto layer 110 and into the contact openings for contacting HR element 109, after which unnecessary portions of aluminum layer 111 are removed from the surface of the structure.

HR element 109 may also be formed of monocrystalline silicon, and, by means of laser annealing, a region of the polycrystalline silicon layer is prepared for defining the resistance region of the element.

Shielding layer 106 is connected to a constant voltage source or to ground through substrate 101 via contact 102. Shield layer 106 may be constructed of many types of conductive material, such as, refractive metals, such as, Mo, Ti or W or refractory metal silicides, such as, $MoSi_2$, $TiSi_2$ or $WSi_2$.

As illustrated in schematic form in FIG. 7, shielding layer 106, spatially separated from HR element 109, shields the element from underlying element 104, which, for example, may be a 5 V line. However, I have discovered that shielding member 106 need only spatially overlap HR element 109 by a partial amount of its full length, which is identified as "X" in FIG. 7. The portion of element 109 not shielded by member 106 is inverted, i.e., functions like a transistor channel and current path, due to the proximity of the field produce by underlying element 104 so that the exposed portion tends to be placed in a kind of "switched on" condition or inverted state, indicated at 109B, thereby significantly reducing the resistance value of HR element 109 if the unexposed portion, X, of HR element 109 is not of a sufficient length due to the punch-through phenomenon. In a "switched on" condition, the resistance value of element 109 will be significantly changed until there is a change, e.g., absence of the electric field effecting the HR element resistance value, which may or may not be the case, or may vary in value, or remain a constant value. Thus, there is no assurance that the design resistance value for HR element will be stable. Therefore, if the length for X is provided to be of a sufficient value, which is still less than the total length of element 109, it is possible to maintain a high resistance value without the element being placed in a "switched on" condition.

As shown in FIG. 12, the resistance characteristics versus resistance length is shown for HR element 109. From these results, it can be seen that if X≧1.6 μm, preferably greater than 1.6 μm, element 109 will be shielded from the effects of an underlying field and will not be place in a "switch on" condition so that any inverted effect will not significantly effect the HR element resistance value and, as a result, the high resistance value of the HR element will be stabilized and maintained. In other words, as long as the length of the HR element is maintain at least 1.6 μm or greater, the high resistance value can be maintained. Thus, the amount of the HR element should be shielded is from 1.6 μm of HR element length up to including its full length.

An example of the formation of HR element 109 is as follows. According to FIG. 12, the minimum length should be equal to or greater than 1.6 μm, preferably greater than 1.6 μm because of the inability to exactly know the resultant length of the HR element after thermal processing because of impurity migration. A mask, e.g., photoresist mask, is utilized for masking the region for the HR element. The mask length is based upon the design rule followed. For example, in a 256K SRAM utilizing 1.2 μm design rule, the length of HR element 109 may be about 5 μm. In the case of a 1M SRAM utilizing a 0.8 μm design rule, the length of HR element 109 may be about 3.5 μm. A mask defining the HR element is formed, such as, from photoresist, and an ion implant is performed for an impurity of As or P at a acceleration energy and a concentration conventional in the art. HR element 109 is produced by means of a two step heat treatment process comprising a first thermal treatment step at 850° C. for 20 minutes, and a second thermal treatment step at 1050° C. for about 30 seconds after removal of the initial photoresist defining the element and the deposit of a covering layer, i.e., $SiO_2$. These temperatures and time period conditions are not intended as exact specifications, as the temperatures and time period conditions could be other values approximating or in a range close to the above exemplified values. The important note is this that, in order to reduce the lateral thermal diffusion of the impurity into regions of the HR element, a two step thermal treatment provides for proper thermal treatment while minimizing the amount of time of such treatment, utilizing an intervening deposited protective or covering layer between the two thermal steps after removal of the photoresist mask. Correspondingly, with a reduction in the amount of thermal treatment time, the amount of such undesirable lateral diffusion is reduced, so that the HR element length and its correspondingly desired high resistance value are not materially affected.

The amount of end diffusion from low resistance regions 108 into the ends of formed HR element 109 is, of course, dependent upon the temperature of the heat treatment process. The lower the temperature, the lower the extent of inward diffusion, which is important not go below the intended HR element length and, particularly not go below 1.6 μm. The above two step heat treatment method provides minimal time for high temperature heat treatment while carrying out the proper impurity diffusion of As or P into low resistance regions 108 without undue lateral diffusion of these impurities into regions of HR element 109 thereby shortening its effective length.

In order to reduce the integration scale of memory cells, it is necessary to consider a reduction in the length of HR element 109. However, a reduction in the HR element length will reduce its resistance value. But a high resistance value can be maintained with reduction in HR element length if the value, X, for the shielded portion of HR element is about $X \geq 1.6$ μm, as generally indicated from FIG. 12, so that there is no necessity to shield the entire HR element length from electric fields generated by surrounding active or passive elements.

FIG. 8 shows the cross section of a SRAM semiconductor memory device utilizing a partial shield structure as explained in the pervious embodiment. Semiconductor substrate 1, e.g., of p-type silicon, contains selected regions that are oxidized to form a field oxide insulating film 2, e.g., $SiO_2$. A p-type channel stop region 3 is provided beneath field insulating film 2 to prevent the creation of a parasitic channel. MOSFETs $Q_3$ and $Q_4$ (only $Q_4$ shown) have a gate insulating film 4, e.g., $SiO_2$, separated by active regions from surrounding field insulating film 2. The n-channel MOSFET $Q_4$ includes a gate electrode, comprising word line, WL, and consists of a double layer film 5 and 6 formed gate oxide film 4, which double film is also part of the gate electrode 7 of driver MOSFET $Q_1$ formed on field oxide film 4. Film 5 may be comprised of polycrystalline silicon and film 6 may be comprised of refractory metal silicide of Mo, Ti or W containing silicon. The n-type source/drain regions 9 and 10 are formed in the active regions in a self-align manner by means of implantation of impurities into substrate 1 which involves a two step process known in the art including the formation of sidewall oxide spacers 11 of $SiO_2$ on the side surfaces of selectively etched gate electrodes 7 and word line, WL.

Thus, word line, WL, and source/drains regions 9 and 10 together constitute transfer MOSFETs $Q_3$ and $Q_4$. Gate electrode 7 and equivalent source/drain regions (not shown) together constitute driver MOSFETs $Q_1$ and $Q_2$. In particular, the drain region of driver MOSFET $Q_1$ is common with source region 9 of transfer MOSFET $Q_4$. MOSFETs $Q_1$–$Q_4$ comprise LDD (Lightly Doped Drain) structures and are formed by techniques and methods known in the art.

Next, a first interlayer insulating film 12 is formed over MOSFETs $Q_1$–$Q_4$ upon which is formed a conductive layer 13 to constitute a shield for a resistance load element $R_2$ formed above the partial shield by shield this load element from the effects of an electric field generated by gate electrode 7. Partial shield 13 may be comprised of a polycrystalline silicon film with a high concentration of implanted impurities, partial shield 13 is connected to a constant potential source, e.g., 5 V ($V_{DD}$), or to ground ($V_{SS}$).

Next, a second interlayer insulating film 14, e.g., $SiO_2$, is formed over partial shield 13, after which conductive interconnect or wiring layer 15 is formed on insulating film 14. Layer 15 is comprised of polycrystalline silicon and is patterned to form a predetermined configuration comprising resistance load element $R_2$ and connecting leads, one to source region 9, through formed via 16 formed in films 4, 12 and 14, and the other to $V_{DD}$. The region of configured layer 15 comprising resistance load element $R_2$ is masked, using conventional resist techniques, so that only connecting leads are implanted with a n-type impurity. As a result, an intrinsic polycrystalline silicon region is formed of high resistance, forming resistance load element $R_2$.

Next, third interlayer insulating film 17 is formed over configured layer 15, followed by the formation of via 21 and the deposit of data line, DL, which is contacted to drain region 10 of transfer MOSFET $Q_1$.

Partial shield 13 is required to spatially overlap only a portion of resistance load element $R_2$ by amount, X, which effectively shields resistance load element $R_2$ from the field effects of the underlying electrode 7 of driver MOSFET $Q_1$, i.e., sufficiently long to prevent the possibility of forming an inverted region in the resistance load element $R_2$ due to the punch-through phenomenon. As a result, the area required for a memory cell constituting MOSFETs $Q_1$–$Q_4$ can be effectively reduce in proportion to a decrease in length of resistance load element $R_2$ without causing it to be more subjective to resistance value variation and significant resistance drop due to the influence of surrounding electric fields and without the need for additional shielding coverage of shield 13 to spatially overlap the entire area of resistance load element $R_2$. It is preferred that shield 13 overlap resistance load element $R_2$. in the range of 1.6 μm or more.

It should be noted that in connection with the foregoing embodiments, a partial shield, line shield 13, can also be formed above resistance load element $R_2$ to shield resistance load element $R_2$ from electric fields of active or passive elements subsequently formed above the element.

The principal of partial shielding in connection with the load elements of the foregoing embodiment apply also to load elements in the form of TFTs, in particular, in the case where these load elements have an offset channel. In this connection, reference is now made to FIG. 9A which illustrates in schematic form a p-channel TFT load element in a semiconductor device. The device includes semiconductor substrate 201 over which is formed an element, such as, polycrystalline silicon interconnect 208, which is connected to $V_{DD}$, such as, 5 V. Above interconnect 208 is polycrystalline silicon or conductive shield 210A formed from a doped polycrystalline silicon layer, e.g., 1000 Å thick, and implanted with As ions. Above shield 210A is the structure of a thin film p-channel TFT comprising impurity implanted polycrystalline silicon gate electrode 206, e.g., 1000 Å thick or in the range of 200 Å to 3,000 Å thick, and impurity implanted polycrystalline silicon film 200 comprising non-doped or shallow n-type (n–) channel region 203 with an associated non-doped or shallow n-type (n–) channel offset region 205 and $p^+$-type, source/drain domain regions 202 and 204. Conductive shield 210A may be about 200 Å to 3,000 Å spaced from polycrystalline silicon film 200 and gate electrode 206 may be about 300 Å spaced from polycrystalline silicon film 200. To be noted is that shield 210A is shorter than the length of channel offset region 205, as it is not necessary for shield 210A to cover the entire offset region to effectively shield it from surrounding electric fields, i.e., there is no or little effect to any change occurring in the OFF current conditions.

Without the presence of shield 210A in the semiconductor device of FIG. 9A, the electric field established by an underlying element, such as, interconnect 208, or other such active or passive element, will cause an inverted channel or "ON" condition in channel offset region 205 above the element 208. If shield 210A is placed at 0 V, an inversion channel will tend to be generated in channel offset region 205 in spite of the presence of shield 210A, and, moreover, the consumption or leakage current, $I_{DDS}$, will be too high. However, if gate electrode 206 is, for example, 5 V and shielding layer or shield 210A is placed at constant voltage, e.g., at 5 V, an inverted channel will not occur in offset region 205. TFT channel 203 will be in a "OFF" condition and the channel offset region 205 will also be in an "OFF" condition no matter what changes occur to the electric field generated by interconnect 208. Thus, in the case of a p-channel TFT, if the shield is set to a constant voltage of about 5 V or more, the consumption or leakage current, $I_{DDS}$, will be maintained at its lowest value.

Conversely, in the case of use of a n-channel TFT as a load element, shield 210A is placed at 0 V, an the resistance value of the channel offset region is in a "ON" condition no matter what changes occur to the electric field generated by interconnect 208.

Thus, when a TFT is employed as a load element, the characteristics of the TFT are stabilized by connecting the shield layer to a constant voltage source ($V_{DD}$) or to ground ($V_{SS}$), no matter what instantaneous changes might occur relative to the electric field at a lower lying element, such as interconnect 208, whether there is a p-channel device with a channel offset region in an "ON" condition or a n-channel device with a channel offset region in an "OFF" condition.

Although the present invention relates to a p-channel TFT load element, it is also possible to apply this invention to a n-channel load element by providing a shield layer according to the foregoing description achieving the same shielding effects.

In the case of a p-channel TFT wherein the shielding layer is at a constant voltage ($V_{DD}$) so that a channel is prevented from being generated in the channel offset region, i.e., the "OFF" condition, the waiting current in the "OFF" condition is significantly reduced so that the overall current consumption of the integrated circuit device, incorporating combination shield and p-channel TFT structures in memory cells, is decreased.

Also, such TFT structures can be shielded from overlying electric fields as well, as illustrated in FIG. 10A. FIG. 10 is the same as FIG. 9A except that FIG. 10 includes additional structure above the TFT structure in the form of a polycrystalline silicon shield 211A, e.g. 1000 Å thick and implanted with As ions, spatially separated from polycrystalline silicon film 200, e.g., in the range of 200 Å to 3,000 Å, and overlying both channel 203 and channel offset region 205. Above shield 211A is another passive or active element, such as, a bit or data line 212. Shield 211A provides for shielding of both channel 203 and channel offset region from the influence of an electric field generated from bit line 212. Alternatively, shield 211A need not overlap channel 203 but may extend only over channel offset region 205. Moreover, shield 211A is shown shorter than the length of channel offset region 205, i.e., it doesn't cover the entire length of the offset region, because it is not necessary for shield 211A to cover the entire offset region to effectively shield it from surrounding electric fields, i.e., there is no or little effect to any change occurring in the OFF current conditions.

FIG. 9B is the same as FIG. 9A except that shield 210B covers or shields the entire extent of channel offset region 205. FIG. 10B is the same as FIG. 10A except that both shields 210B and 211B cover or shield the entire extent of channel offset region 205.

It should be noted that the thinner the polycrystalline silicon layer comprising channel film 200, the more effectively operated as a TFT relative to its ON/OFF conditions. However, the thinner this channel layer, the more effective is a surrounding electric field on the operating characteristics of the transistor. Therefore, the employment of shield 210 or 211 becomes increasingly important as well as more effective as it is positioned closer to channel film 200.

FIG. 11 is a cross sectional view of a SRAM cell 300 of a SRAM memory device having a shield structure of this invention. The particular cross section shows the structure of $Q_4$ and $Q_5$ as well as part of $Q_1$ of the cell shown in FIG. 3. The SRAM memory device of FIG. 11 is constructed by employing conventional techniques employing a conventional structural configuration, except for the formation of shield layer 310 forming shield 310A in overlapping relation with TFT, $Q_5$. An example of construction of such a SRAM memory device is disclosed in patent application Ser. No. 07/871,871, filed Apr. 20, 1992, which is incorporated herein by reference thereto.

In FIG. 11, element isolation or LOCOS regions 302 and gate oxide film 303 are formed on substrate 301 in a conventional manner. Next, first polycrystalline silicon layer 306 is formed on oxide regions 301 and 302 and is patterned to form gate electrodes 306A and 306B. Source region 304 and drain region 305 are formed in self-aligned manner using gate electrode 306B as a mask as well as other techniques as known in the art. This is followed with the formation of sidewalls 315 and the deposit of first oxide layer 307, followed by the formation of second polycrystalline silicon layer 308 and the selective etching to form separate ground line, $V_{SS}$, 308A and connection pad 308B. Next, second oxide layer 309 is deposited followed by the selective etch through oxide layers 307,309 to expose a portion of gate electrode 306A. Then, third polycrystalline silicon layer 310 is formed, which is selectively etched to form separate shield layer 310A and interconnect contact 310B. Next, third, thin oxide layer 311 is deposited on layer 310 after which is formed fourth polycrystalline silicon layer 312 which is selectively etched to form gate electrode 312A for $Q_5$. This is followed by the deposit of fourth, thin film oxide layer 313 which is selectively etched to form thin gate oxide film 313A. Next, oxide films 311, 313 are removed in the area of the interconnect contact 310B to gate electrode 306A. This is followed by the formation of fifth polycrystalline silicon layer 314 which is selectively etched to form the channel 314A, one end of which is contiguous with channel offset region 314B and connection contact region 314C to interconnect contact 310B. The other end of channel 314A is contiguous with connection to $V_{DD}$, as indicated at 314D. Channel and channel offset regions 314A and 314B are patterned and doped $n^+$ (e.g., arsenic implantation), and regions 314C and 314D are patterned and doped p+ (e.g., selective boron implantation) to, respectively, form the source/drain regions for channel regions 314A and 314B of $Q_5$.

The structure is then cover by a thick oxide layer 316. In this layer, a shield can be formed to at least channel offset region 314B, similar to that illustrated in FIG. 10. Next, a metal connection via 317 is formed through oxide layers 309, 311, 313 and 316 to connection pad 308B. Bit or data line 318 ($\overline{DL}$), e.g., formed of Al, is formed and connected to drain region 305 of $Q_4$ via connection pad 308B. This is followed by deposit of oxide layer 319 and formation of main word line 320, e.g., formed of Al. The use of channel offset region 314B prevents the increase of OFF state current and drain current, $I_D$, of the gate back voltage, achieving excellent ON/OFF characteristics. However, owing to the influence of underlying electric field generated from another element beneath offset region 314B, the offset region is inverted. This inversion deteriorates the ON/OFF characteristics of the TFT. Moreover, the thickness of the channel region film 314 should be very thin, e.g., 350 Å, in order to increase the ON state current of the TFT, $Q_5$. As a result, such thin channel regions 314A, 314B tend to be significantly influenced by such electric fields. However, shield 310A shields channel offset region 314B from such electric fields, such as an electric field generated from gate electrode 306A, thereby decreasing the waiting or OFF time current consumption because of the lack of, or tendency for, an inverted channel to be formed in offset region 314B. As a result, the waiting time current consumption is significantly reduced across all of the SRAM memory cells so that overall current consumption in operation of the device is significantly decreased.

Also, it has been observed that, as the spatial overlap region or relationship between the $V_{SS}$ line 308A and channel offset region 314B is increased, the waiting time current consumption is correspondingly increased. Thus, shield layer 310A interposed between $V_{SS}$ line 308A and channel offset region 314B significantly reduces the current consumption.

An alternative approach to the use of shield 310A is to employ a thick silicon oxide film beneath TFT, $Q_5$, e.g., 2000 Å thick $SiO_2$ layer thereby providing a large distance between underlying elements generating an electric field. While this approach is effective, the utility of the shield 310A is preferred as being more effective.

While the invention has been described in conjunction with several specific embodiments, it is evident to those skilled in the art that many further alternatives, modifications and variations will be apparent in light of the foregoing description. Thus, the invention described herein is intended to embrace all such alternatives, modifications, applications and variations as fall within the spirit and scope of the appended claims.

What is claimed is:

1. An IC memory device comprising a plurality of memory cells, each memory cell containing load elements comprising resistance elements and other cell circuit components that are operative with the resistance elements to indicate ON or OFF conditions in said memory cell, the device further comprising other active or passive elements that are physically associated with said memory cell generating an electric field that deteriorates operating characteristics of said resistance elements, and a shield layer formed in said memory cell spatially separated from each of said resistance elements by an insulating film, said shield layer spatially overlapping only substantially a minimum portion of a length of said resistance elements that is predetermined to prevent an electric field from deteriorating said resistance elements operating characteristics, said shield layer connected to a bias level.

2. The IC memory device of claim 1 wherein the spatial overlap of said shield layer relative to lengths of said resistance elements is X wherein $X \leq 1.6$ μm.

3. The IC memory device of claim 2 wherein said resistance elements have a resistance value in the range of about 100 GΩ to 10 TΩ and a length in the range of 2 μm to 4 μm.

4. An IC memory device comprising a plurality of memory cells, each memory cell containing load elements comprising thin film transistors having a thin film channel region and a channel offset region and other cell circuit components that are operative with said thin film transistors to indicate ON or OFF conditions in said memory cell, the device further comprising other active or passive elements that are physically associated with said memory cell generating an electric field that deteriorates operating characteristics of said channel offset region by causing an inverted channel to be formed therein, a shield layer formed in said memory cell spatially separated from each of said thin film transistors by an insulating film, said shield layer spatially overlapping substantially a minimum portion of a length of said channel offset regions that is predetermined to prevent passage of an electric field causing formation of said inverted channel deteriorating said thin film transistor operating characteristics.

5. The IC memory device of claim 4 wherein said shield layer spatially underlies said channel offset region in said memory cell, a second shield layer formed in said memory cell spatially separated from each of said thin film transistors by an insulating film and spatially overlying said channel offset region in said memory cell.

6. The IC memory device of claim 5 wherein said second shield spatially overlies both said channel region and said channel offset region.

7. The IC memory device of claim 4 wherein said thin film transistor is a p-channel transistor, a constant voltage applied to said shield layer.

8. A semiconductor device, comprising:

a semiconductor substrate;

a first insulating film formed on the substrate;

a conductive layer which is formed on the first insulating film and connected to a constant electrical potential;

a second insulating film formed on the conductive layer; and a silicon film which is formed on the second insulating film and includes a low resistance contact region and a high resistance region, in which:

the conductive layer is disposed below and spatially overlaps a sufficiently large area of the high resistance region to substantially shield the high resistance region from electrical field effects originating below the high resistance region.

9. The semiconductor device of claim 8 wherein the conductive layer spatially overlaps a length of the high resistance region by a distance $X \leq 1.6$ μm.

10. The semiconductor device of claim 9 wherein the high resistance region has a resistance of approximately 100 GΩ to 10 TΩ and a length of approximately 2 μm to 4 μm.

11. A semiconductor memory, comprising:

a semiconductor substrate; and a memory cell formed on the substrate, the memory cell including:

a conductive layer formed over the substrate;

an insulating film formed on the conductive layer;

a polycrystalline silicon resistor formed on the insulating film; and an electrical contact connected to the resistor, in which:

the conductive layer is disposed below and spatially overlaps a sufficiently large area of the resistor to substantially shield the resistor from electrical field effects originating below the resistor.

12. A semiconductor memory, comprising:

a semiconductor substrate; and a memory cell formed on the substrate, the memory cell including:

a shield layer formed over the substrate;

an insulating film formed on the shield layer;

a thin film transistor load element which is formed on the insulating film and has a channel region and a channel offset region, in which:

the shield layer is disposed below and spatially overlaps a sufficiently large area of the channel offset region to prevent electrical field effects originating below the channel offset region from causing an inverted channel from being formed in the channel offset region.

13. The semiconductor memory of claim 12 wherein the shield layer extends under the channel offset region from the channel region.

14. The semiconductor memory of claim 12 further comprising:

an additional insulating film formed on the load element; and an additional shield layer which is formed on the additional insulating film and spatially overlies at least a portion of the channel offset region.

15. The semiconductor memory of claim 12 wherein:

the load element is a p-channel device; and the shield layer is connected to a constant electrical potential.

16. The semiconductor memory of claim 12 wherein the shield layer is further disposed below and spatially overlaps a portion of the channel region which is adjacent to the channel offset region, and an interface between the channel region and the channel offset; region.

* * * * *